United States Patent
Kollmitzer (10) Patent No.: US 12,248,038 B2
(45) Date of Patent: Mar. 11, 2025

(54) HALL SENSOR, METHOD FOR CALIBRATING A HALL SENSOR, AND CALIBRATION APPARATUS FOR A HALL SENSOR

(71) Applicant: Infineon Technologies AG, Neubiberg (DE)

(72) Inventor: Benjamin Kollmitzer, Pörtschach am Wörther See (AT)

(73) Assignee: Infineon Technologies AG, Neubiberg (DE)

(*) Notice: Subject to any disclaimer, the term of this patent is extended or adjusted under 35 U.S.C. 154(b) by 172 days.

(21) Appl. No.: 18/066,697

(22) Filed: Dec. 15, 2022

(65) Prior Publication Data
US 2023/0194635 A1 Jun. 22, 2023

(30) Foreign Application Priority Data
Dec. 21, 2021 (DE) .................. 102021134066.7

(51) Int. Cl.
*G01R 33/07* (2006.01)
*G01R 33/00* (2006.01)
*G01R 35/00* (2006.01)

(52) U.S. Cl.
CPC ......... *G01R 33/07* (2013.01); *G01R 33/0017* (2013.01); *G01R 35/005* (2013.01)

(58) Field of Classification Search
CPC ............ G01R 33/0005; G01R 33/0017; G01R 33/0035; G01R 33/07; G01R 33/077; G01R 35/00; G01R 35/005
USPC ............................ 324/202, 207.2, 251, 117 H
See application file for complete search history.

(56) References Cited

U.S. PATENT DOCUMENTS

| 9,024,622 B2 * | 5/2015 | Hohe ................. G01R 33/0017 324/202 |
| 2012/0153942 A1 * | 6/2012 | van Veldhoven .. G01R 33/0017 324/239 |
| 2021/0293904 A1 * | 9/2021 | Ostermann ........ G01R 33/0017 |

FOREIGN PATENT DOCUMENTS

| CN | 111443310 A | 7/2020 |
| DE | 102007041230 B3 | 4/2009 |
| DE | 202021104158 U1 * | 9/2021 |
| JP | 6-265611 A | 9/1994 |

(Continued)

OTHER PUBLICATIONS

Foreign Document & Translation of DE 202021104158 U1, Pub. Date Sep. 16, 2021 (Year: 2020).*

(Continued)

*Primary Examiner* — Paresh Patel
*Assistant Examiner* — Rahul Maini
(74) *Attorney, Agent, or Firm* — Harrity & Harrity, LLP (57) ABSTRACT

A Hall sensor is disclosed. The Hall sensor comprises a first Hall element, configured to detect a component of a magnetic field in a first direction a using a sensitive area of the first Hall element. The Hall sensor further comprises a second Hall element, configured to detect a component of the magnetic field in a second direction b using a sensitive area of the second Hall element. The Hall sensor further comprises a conductor track, configured to generate a calibration magnetic field. The calibration magnetic field has a significant component on the sensitive area of the first Hall element in the second direction b. The calibration magnetic field further has a significant component on the sensitive area of the second Hall element in the first direction a.

20 Claims, 6 Drawing Sheets

(56) References Cited

FOREIGN PATENT DOCUMENTS

| | | |
|---|---|---|
| WO | 2007122542 A2 | 11/2007 |
| WO | 2021005532 A1 | 1/2021 |

OTHER PUBLICATIONS

TDK; Translation of DE202021104158U1; Translated by Clarivate (Year: 2021).*

* cited by examiner

HALL SENSOR, METHOD FOR CALIBRATING A HALL SENSOR, AND CALIBRATION APPARATUS FOR A HALL SENSOR

CROSS REFERENCE TO RELATED APPLICATION

This application claims priority to German Patent Application No. 102021134066.7 filed on Dec. 21, 2021, the content of which is incorporated by reference herein in its entirety.

TECHNICAL FIELD

The present disclosure relates to magnetic field detection. Example implementations of the present disclosure relate to a Hall sensor, to a method for calibrating a Hall sensor and to a calibration apparatus for a Hall sensor.

BACKGROUND

Vertical Hall sensors are used for magnetic angle detection, inter alia. A symmetrical arrangement of individual Hall elements of a Hall sensor and spinning current operation ensure that an interfering offset voltage of the Hall sensor is reduced. As a result, vertical Hall sensors have very good amplitude synchronism and linearity.

Mechanical shear stress on the Hall sensors may lead to changes in the direction of measurement and hence to errors in the angle output. These changes may be compensated for to a very large extent by way of shear stress sensors.

However, there may still be a difference between the direction of measurement and a setpoint direction intended for the Hall sensor. One possible reason for the difference may be an undesirable offset voltage of the shear stress sensors. The difference may be a variance of several tenths of a degree under normal production conditions.

There may therefore be a need for improved Hall sensors. The object of the present implementation may be considered that of bringing about such an improvement for Hall sensors.

SUMMARY

The object described above is achieved by way of apparatuses and methods according to the independent claims. Advantageous implementations are dealt with in the dependent claims.

According to a first aspect of the present disclosure, a Hall sensor is provided. The Hall sensor includes a first Hall element, configured to detect a component of a magnetic field in a first direction using a sensitive area of the first Hall element. The Hall sensor further includes a second Hall element, configured to detect a component of the magnetic field in a second direction using a sensitive area of the second Hall element. The Hall sensor further includes a conductor track, configured to generate a calibration magnetic field. The calibration magnetic field has a significant component on the sensitive area of the first Hall element in the second direction. The calibration magnetic field further has a significant component on the sensitive area of the second Hall element in the first direction.

In some example implementations, the first direction is orthogonal to the second direction.

In some example implementations, the first Hall element and/or the second Hall element is a vertical Hall element.

In some example implementations, the Hall sensor includes at least one further first Hall element, configured to detect a component of the magnetic field in the first direction using a sensitive area of the at least one further first Hall element. The Hall sensor may further include at least one further second Hall element, configured to detect a component of the magnetic field in the second direction using a sensitive area of the at least one further second Hall element. The calibration magnetic field may have a significant component on the sensitive area of the at least one further first Hall element in the second direction. The calibration magnetic field may further have a significant component on the sensitive area of the at least one further second Hall element in the first direction.

In some example implementations, the Hall sensor further includes a shear stress sensor, configured to detect a mechanical shear stress on the sensitive area of the first Hall element and on the sensitive area of the second Hall element.

In some example implementations, the Hall sensor further includes a calibration apparatus, configured to pass a current through the conductor track in order to generate the calibration magnetic field. The calibration apparatus may further be configured to detect a first voltage across the first Hall element and to detect a second voltage across the second Hall element. The first voltage and the second voltage may be caused by the calibration magnetic field. The calibration apparatus may further be configured to determine an orientation error of the Hall sensor based on the detected first voltage and the detected second voltage.

In some example implementations, the calibration apparatus is further configured to pass a first current through the conductor track and to detect the first voltage and the second voltage while the first current is passed through the conductor track. The calibration apparatus may further be configured to pass a second current through the conductor track and to detect the first voltage and the second voltage while the second current is passed through the conductor track.

In some example implementations, a current magnitude of the first current corresponds to a current magnitude of the second current. In the example implementations, a direction of the first current is opposite to a direction of the second current.

In some example implementations, the calibration apparatus is further configured to determine the orientation error based on the detected mechanical shear stress.

In some example implementations, the calibration magnetic field has a significant component on the sensitive area of the first Hall element in the first direction. The calibration magnetic field may have a significant component on the sensitive area of the second Hall element in the second direction. The calibration apparatus may further be configured to determine a magnetic sensitivity of the Hall sensor based on the detected first voltage and the detected second voltage.

In some example implementations, the Hall sensor further includes a second conductor track. The calibration apparatus may further be configured to pass a current through the second conductor track in order to generate a second calibration magnetic field. The second calibration magnetic field may have a significant component on the sensitive area of the first Hall element in the first direction. The second calibration magnetic field may have a significant component on the sensitive area of the second Hall element in the second direction. The calibration apparatus may further be configured to determine a magnetic sensitivity of the Hall sensor based on a voltage across the first Hall element and across the second Hall element that is caused by the second calibration magnetic field.

In some example implementations, the calibration apparatus is further configured to determine the orientation error based on the determined magnetic sensitivity.

In some example implementations, the conductor track runs along at least one metallization plane of the Hall sensor at a vertical distance from the first Hall element and from the second Hall element.

In some example implementations, the conductor track runs along the at least one metallization plane at an angle of 45° to the first Hall element and at an angle of 45° to the second Hall element.

In some example implementations, the conductor track runs along the at least one metallization plane at an angle of 90° to the first Hall element and at an angle of 90° to the second Hall element.

In some example implementations, the conductor track runs along the at least one metallization plane in multiple turns.

In some example implementations, at least part of the conductor track is arranged symmetrically with respect to a point of symmetry of a group of Hall elements of the Hall sensor. The group of Hall elements may include the first Hall element and the second Hall element.

In some example implementations, the Hall sensor further includes multiple metallization planes of different thickness at vertical distances from one another. The conductor track may run along one of the multiple metallization planes. The one of the multiple metallization planes may have a maximum thickness among the multiple metallization planes.

In some example implementations, the Hall sensor is further configured to use the magnetic field to determine an angle of the Hall sensor with respect to an object causing the magnetic field.

According to a second aspect of the present disclosure, a method for calibrating a Hall sensor is provided. The Hall sensor includes a first Hall element, a second Hall element and a conductor track. The method includes passing a current through the conductor track in order to generate a calibration magnetic field. The method further includes determining an orientation error of the Hall sensor based on the calibration magnetic field.

In some example implementations, the determining of the orientation error includes detecting a first voltage across the first Hall element and a second voltage across the second Hall element. The first voltage and the second voltage may be caused by the calibration magnetic field.

According to a third aspect of the present disclosure, a calibration apparatus for a Hall sensor is provided. The Hall sensor includes a first Hall element, a second Hall element and a conductor track. The calibration apparatus includes an electronic circuit, configured to pass a current through the conductor track of the Hall element in order to generate a calibration magnetic field. The electronic circuit is further configured to detect a first voltage across the first Hall element and a second voltage across the second Hall element based on the calibration magnetic field. The electronic circuit is further configured to determine an orientation error of the Hall element based on the detected first voltage and the detected second voltage.

BRIEF DESCRIPTION OF THE DRAWINGS

Some examples of apparatuses and/or methods are explained in more detail merely by way of illustration below with reference to the accompanying figures, in which.

DETAILED DESCRIPTION

Some examples will now be described more thoroughly with reference to the accompanying figures. However, further possible examples are not restricted to the features of these implementations described in detail. These may have modifications of the features and also counterparts and alternatives to the features. Furthermore, the terminology used herein for describing specific examples is not intended to be limiting for further possible examples.

Throughout the description of the figures, identical or similar reference signs refer to identical or similar elements or features which may be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, e.g., only A, only B, and A and B, unless expressly defined otherwise in an individual case. As alternative wording for the same combinations, it is possible to use "at least one from A and B" or "A and/or B". That applies equivalently to combinations of more than two elements.

If a singular form, e.g., "a, an" and "the", is used and the use of only a single element is defined neither explicitly nor implicitly as obligatory, further examples may also use multiple elements in order to implement the same function. If a function is described below as being implemented using multiple elements, further examples may implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof.

Figure 1:
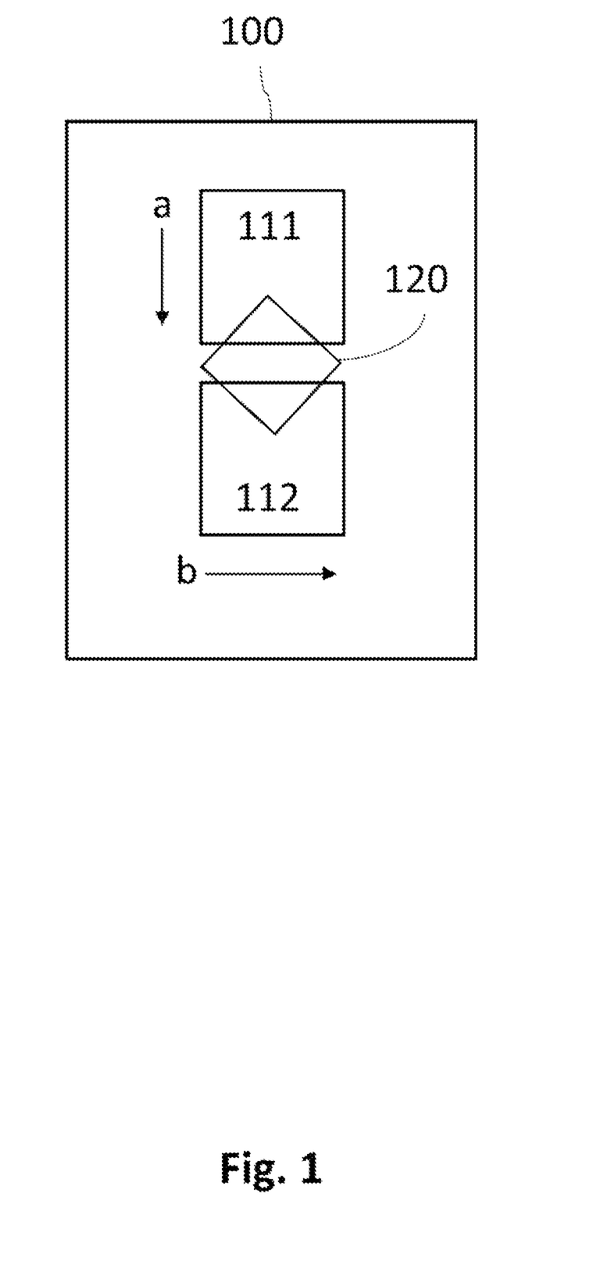
FIG. 1 shows an example of a Hall sensor.

FIG. 1 shows an example of a Hall sensor 100 according to the implementation. The Hall sensor 100 may be understood as any sensor for detecting a magnetic field based on the Hall effect. The Hall sensor 100 may be for example an integrated circuit having at least one semiconductor layer. The semiconductor layer may be embedded for example in a depression or well in a substrate of the integrated circuit (for example with opposite doping). The semiconductor layer may have at least one electrical contact, from which a Hall voltage related to the magnetic field may be tapped off. Such a semiconductor layer may be referred to as a Hall element. A Hall element may be electrically insulated from further Hall elements on the same substrate by way of an interposed layer of the substrate.

The Hall sensor 100 comprises a first Hall element 111 and a second Hall element 112. The first Hall element 111 is configured to detect a component of a magnetic field in a first direction a (and/or counter to the first direction a) using a sensitive area of the first Hall element 111. The second Hall element 112 is configured to detect a component of the magnetic field in a second direction b (and/or counter to the second direction b) using a sensitive area of the second Hall element 112.

In some example implementations, the first Hall element 111 and/or the second Hall element 112 is a vertical Hall element. A vertical Hall element is able to detect a magnetic field parallel to a surface of the Hall sensor 100. The vertical Hall element may be referred to as "vertical" insofar as a sensitive area of the vertical Hall element is arranged perpendicularly to the surface of the Hall sensor 100. This may be advantageous inter alia because electrical contacts of the vertical Hall element need to be provided at only one edge or on only one side of the Hall sensor 100. This facilitates manufacture of the Hall sensor 100. Additionally, the Hall sensor 100 may therefore have a high level of compatibility with other standard semiconductor components. In other example implementations, the first Hall element 111 and/or the second Hall element 112 is a different Hall element type, for example a lateral Hall element. In some example implementations, the Hall sensor 100 incorporates various Hall element types.

The direction a and the direction b in which the first Hall element 111 and the second Hall element 112 detect a component of the magnetic field may be understood as different directions. The direction a and the direction b thus have an angle offset from one another not equal to 0. In preferred example implementations, the first direction a is orthogonal to the second direction b. This may increase a linearity and a measurement range of the magnetic field detection.

The sensitive area of the first Hall element 111 or of the second Hall element 112 may be understood within the context of the present disclosure as an area of the semiconductor layer of the respective Hall element. The sensitive area is characterized in that, when a magnetic field flows through, it produces a Hall voltage related to the magnetic field on one contact of the respective Hall element. The resultant Hall voltage may in particular be related to a specific component of the magnetic field, for example to a component of the magnetic field that has a specific direction in relation to an alignment of the sensitive area. Such a component may have a direction perpendicular to the sensitive area, for example. The component of the magnetic field may be understood as an orthogonal projection of the magnetic field onto a coordinate axis with the direction.

In some example implementations, the Hall sensor 100 is configured to use the magnetic field to determine an angle of the Hall sensor 100 with respect to an object causing the magnetic field. The Hall element 100 is able to determine the angle for example based on the flux density and/or a change in the flux density of the magnetic field over time. Alternatively, the Hall sensor 100 may be used in any application with magnetic field detection. By way of example, the Hall sensor 100 may be configured to determine a position and/or movement of an object causing the magnetic field.

The first direction a and the second direction b may be understood as the setpoint direction, measurement direction or intended sensitivity direction of the first Hall element 111 or second Hall element 112. The setpoint direction is the direction in which the respective sensitive area is intended to be magnetically sensitive. The setpoint direction may be for example a direction that produces a Hall voltage proportional to the flux density of the respective component of the magnetic field. An actual direction of the first Hall element 111 or second Hall element 112 may be understood as an actual sensitivity direction. An (angle) difference between the actual direction and the setpoint direction may involve for example undesirable physical effects or technical limitations when manufacturing the Hall sensor 100. The difference may lead to a measurement error, for example during angle detection for an object generating the magnetic field. Such a measurement error may be referred to as an orientation error (or orthogonality error).

The object of the present implementation may be considered to be that of determining the orientation error and correcting it for example by calibrating the Hall sensor 100.

Referring back to FIG. 1: the Hall sensor 100 further comprises a conductor track 120. The conductor track 120 may be any electrical conductor. The conductor track 120 may be for example a wire on chip (WOC), that is to say an electrical conductor introduced in a metallization plane of the Hall sensor 100.

The conductor track 120 is configured to generate a calibration magnetic field. The calibration magnetic field has a significant component on the sensitive area of the first Hall element 111 in the second direction b. In other words: the calibration magnetic field has a significant component on the sensitive area of the first Hall element 111 in a direction, direction b, that is different from a setpoint direction of the first Hall element 111, the direction a. Similarly, the calibration magnetic field has a significant component on the sensitive area of the second Hall element 112 in the first direction a.

The conductor track 120 may generate the calibration magnetic field for example by way of a flow of current through the conductor track 120. In this case, a direction and flux density of the calibration magnetic field is obtained from the principles of electromagnetism. A contour of the conductor track 120 may definitively influence the direction of the calibration magnetic field and therefore have great significance when designing the Hall sensor 100. Illustrative conductor track contours (configurations) are explained in more detail with reference to FIG. 2a-f.

A significant component of the calibration magnetic field on a sensitive area of a Hall element may be assumed for the purposes of the present disclosure if the component penetrates the sensitive area with a measurable flux density, that is to say a flux density that is distinctly above a measurement inaccuracy of the Hall sensor 100. In some example implementations, the component has a flux density that is not or only slightly (for example by 0.1% or 1%) reduced compared to the flux density of the calibration magnetic field on the sensitive area.

In some example implementations, the calibration magnetic field has a significant component on the sensitive area in a direction orthogonal to the setpoint direction, for example if the direction a is orthogonal to the direction b. This may increase an accuracy for detecting an orientation error of the Hall sensor 100.

In FIG. 1, part of the conductor track 120 is arranged inside the block that represents the first Hall element 111 or the second Hall element 112. This is due to a two-dimensional representation of the Hall sensor 100 in FIG. 1. In this case, part of the conductor track 120 may run above and/or below the first Hall element 111 and the second Hall element 112. That is to say that the conductor track 120 may run along at least one metallization plane of the Hall sensor 100 at a vertical distance from the first Hall element 111 and the second Hall element 112. At a vertical distance may relate in this instance to a distance in a third spatial dimension of the Hall sensor 100 that is not shown in FIG. 1.

In the example of the Hall sensor 100 that is shown in FIG. 1, the conductor track 120 runs along the at least one metallization plane of the Hall sensor 100 at an angle of 45° to the first Hall element 111 and at an angle of 45° to the second Hall element 112. The angle of 45° may be understood as the angle between a portion of the conductor track 120 that runs above or below the respective Hall element and a sensitive area of the respective Hall element that is (vertically) offset therefrom. This may be advantageous, because the resultant calibration magnetic field may be used to determine not only the orientation error but additionally a magnetic sensitivity of the first Hall element 111 and the second Hall element 112. The angle specification of 45° should be understood to have tolerances. By way of example, the angle may be 45°±1%, ±0.1% or ±0.01%. In other example implementations, the conductor track 120 may run at a different angle to the first Hall element 111 than is shown in FIG. 1 and at a different angle to the second Hall element 112. The conductor track 120 may run for example at an angle α>0° to the first Hall element 111 and at an angle β>0° to the second Hall element 112. In some example implementations, the conductor track 120 runs along the at least one metallization plane of the Hall sensor 120 at an angle of 90° to the first Hall element 111 and at an angle of 90° to the second Hall element 112. This may increase a measurement accuracy for detecting the orientation error of the Hall sensor 100.

In other example implementations, the conductor track 120 may have a different shape (e.g., a round shape) than that shown in FIG. 1 or a different arrangement in the Hall sensor 100. In some example implementations, the conductor track 120 runs along multiple metallization planes of the Hall sensor 100 or beside the first Hall element 111 and/or the second Hall element 112.

In some example implementations, the conductor track 120 runs along the at least one metallization plane in multiple turns. This may increase a flux density of the calibration magnetic field and facilitate detection of the calibration magnetic field. In some example implementations, the Hall sensor 100 comprises multiple metallization planes of different thickness at vertical distances from one another, the conductor track 120 running along one of the multiple metallization planes. In preferred example implementations, the one of the multiple metallization planes has a maximum thickness among the multiple metallization planes. By way of example, the conductor track 120 may run in one or more metallization planes configured for a higher electrical power (relative to the remaining metallization planes of the Hall sensor 100).

The Hall sensor 100 may contribute to solving the aforementioned problem of determining an orientation error of the Hall sensor 100. The Hall sensor 100 may allow the calibration magnetic field to be generated for this purpose. The calibration magnetic field may be generated on the sensitive area of the first Hall element 111 or of the second Hall element 112 in such a way that it is not "strictly" aligned along the setpoint direction of the first Hall element 111 or of the second Hall element 112. A measurement of the Hall voltage produced by way of the calibration magnetic field permits conclusions about the orientation error. One possible procedure for generating the calibration magnetic field and determining the orientation error is explained in more detail with reference to FIG. 3.

A conventional approach to determining an orientation error of a Hall sensor may be for example generating a rotating magnetic field to which the Hall sensor is exposed. Output signals from vertical signal paths of the Hall sensor may then be analyzed to determine the orientation error. However, this may require specific magnet test hardware that needs to be matched specifically to the Hall sensor. Such magnet test hardware may be costly and susceptible to hardware defects. A Hall sensor according to the implementation, such as the Hall sensor 100, may reduce costs for calibration measurements, on the other hand, for example as a result of a WOC structure. The WOC structure may allow the orientation error to be measured and calibrated precisely and with little test effort, e.g., using standard front-end or back-end test hardware.

In other example implementations, the Hall sensor 100, unlike what is shown in FIG. 1, comprises at least one further first Hall element, configured to detect a component of the magnetic field in the first direction a using a sensitive area of the at least one further first Hall element. In the example implementations, the Hall sensor 100 comprises at least one further second Hall element, configured to detect a component of the magnetic field in the second direction b using a sensitive area of the at least one further second Hall element. In the example implementations, the calibration magnetic field has a significant component on the sensitive area of the at least one further first Hall element in the second direction b and a significant component on the sensitive area of the at least one further second Hall element in the first direction a. By way of example, the Hall sensor 100 may comprise n≥1 first Hall elements and m≥2 second Hall elements. This may be advantageous to allow for example a symmetrical design of the Hall sensor 100 and to increase fail safety of the Hall sensor 100 by way of redundant Hall elements.

It will be noted that the arrangement or alignment shown in FIG. 1 for the first Hall element 111 and the second Hall element 112 in relation to one another and relative to the Hall sensor 100 and also the size ratio of the Hall elements in relation to one another and the shape thereof that are shown in FIG. 1 merely serve to illustrate the Hall sensor 100. In other example implementations, the first Hall element 111 and the second Hall element 112 may have a different arrangement in the Hall sensor 100, a different alignment, a different size ratio in relation to one another and a different shape than those shown in FIG. 1. In some example implementations, a group of Hall elements of the Hall sensor 100 has a point of symmetry and at least part of the conductor track 120 is arranged symmetrically with respect to the point of symmetry. The group of Hall elements in this case comprises the first Hall element 111 and the second Hall element 112. A symmetrical design of this kind may increase a homogeneity of the calibration magnetic field.

It will be noted that the representation of the first direction a and the second direction b in FIG. 1 is likewise used for the purposes of illustration. In other example implementations, the first Hall element 111 and the second Hall element 112 are configured to detect a component of the magnetic field in a first direction a or second direction b that run differently in space than what is shown in FIG. 1. In particular, the first direction a may have a different angle relative to the second direction b than the angle obtained from FIG. 1 (here an angle of intersection of approximately 90°).

Detailed information regarding a possible implementation of a Hall sensor according to the implementation is explained with reference to FIG. 2a-f, which show illustrative conductor track configurations of an illustrative Hall sensor 200.

The Hall sensor 200 comprises four first Hall elements X1 to X4, configured to detect a component of a magnetic field in a first direction a using a sensitive area of the first Hall elements X1 to X4. The Hall sensor 200 further comprises four second Hall elements Y1 to Y4, configured to detect a component of the magnetic field in a second direction b, which is orthogonal to the direction a, using a sensitive area of the second Hall elements Y1 to Y4.

Figure 2A:
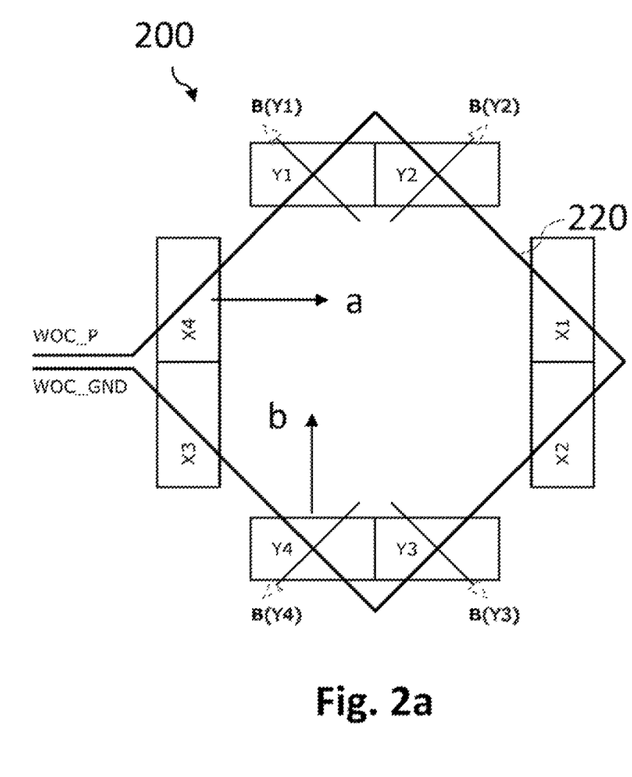
FIG. 2a-2f show illustrative conductor track configurations of an illustrative Hall sensor.
Figure 2B:
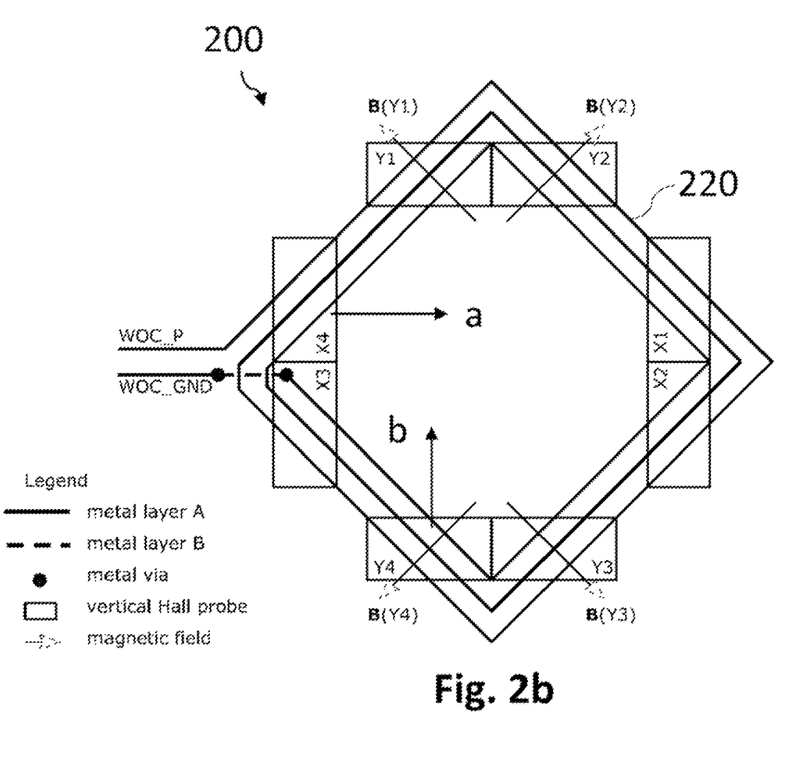

The first Hall elements X1 to X4 are arranged in pairs beside one another (X1 beside X2, X3 beside X4), the pairs being arranged on opposite regions of a layer of the Hall sensor 200. The second Hall elements Y1 to Y4 are likewise arranged in pairs beside one another (Y1 beside Y2, Y3 beside Y4), the pairs being arranged on opposite regions of the layer of the Hall sensor 200. In FIG. 2a-e, the respective Hall element pairs are opposite one another in parallel. In FIG. 2f, the respective Hall element pairs are diagonally opposite one another.

The arrangement of the first Hall elements X1 to X4 and of the second Hall elements Y1 to Y4 is axially symmetrical with respect to an axis running through a center of the layer of the Hall sensor 200 that is shown in FIG. 2a-2f.

Figure 2C:
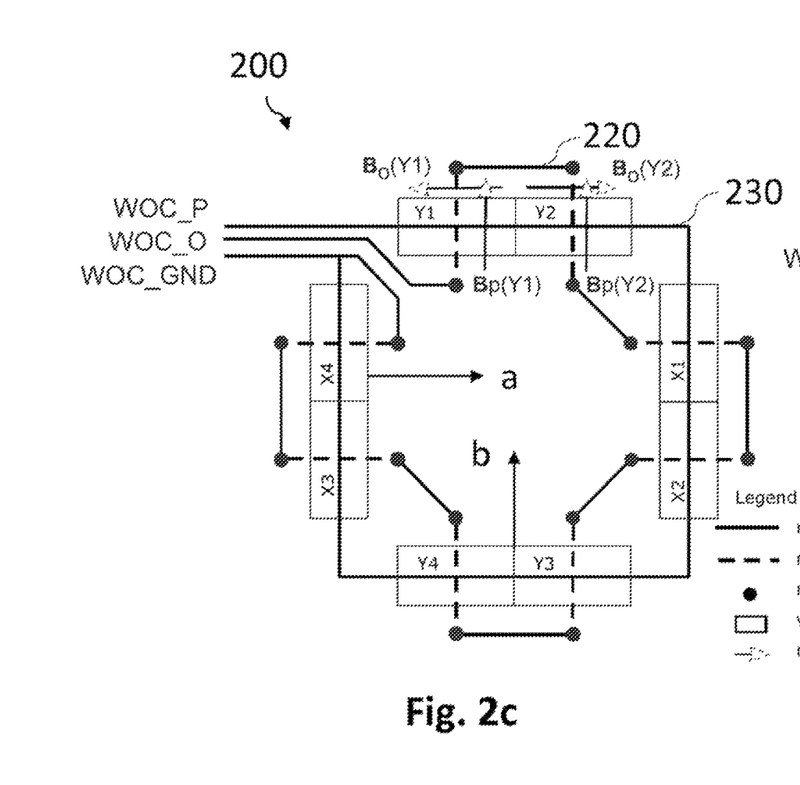
Figure 2D:
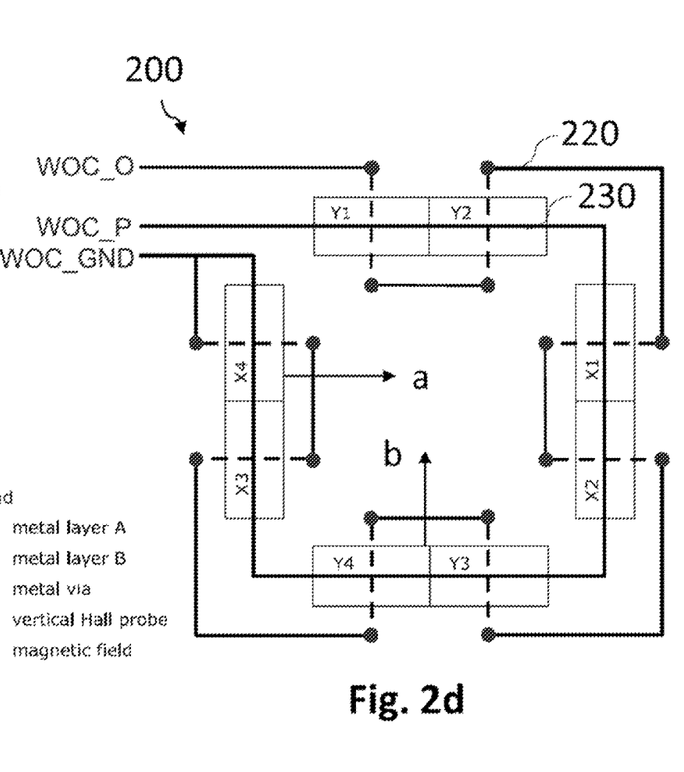
Figure 2E:
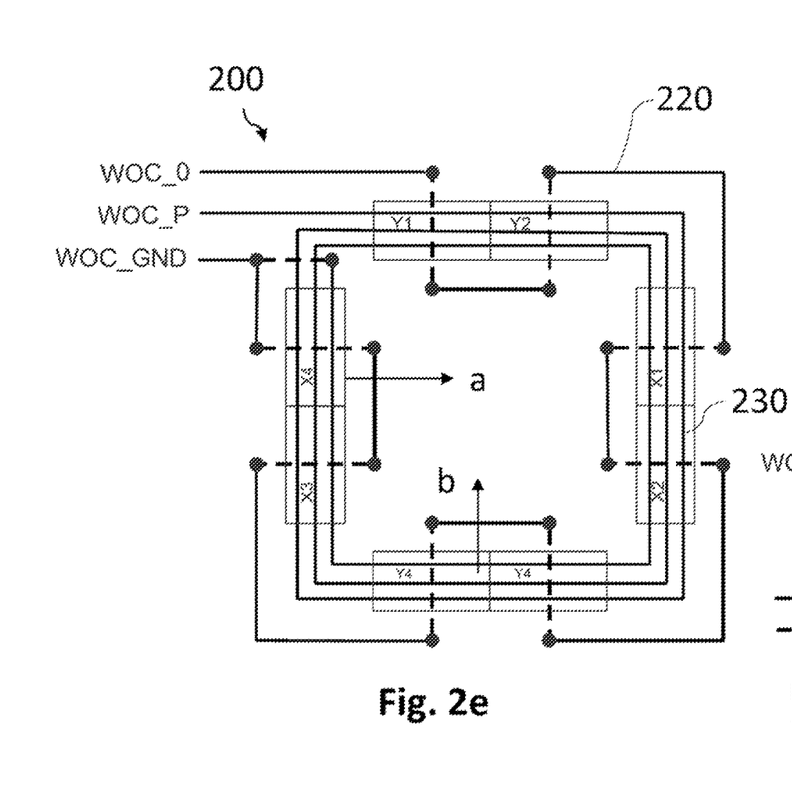
Figure 2F:
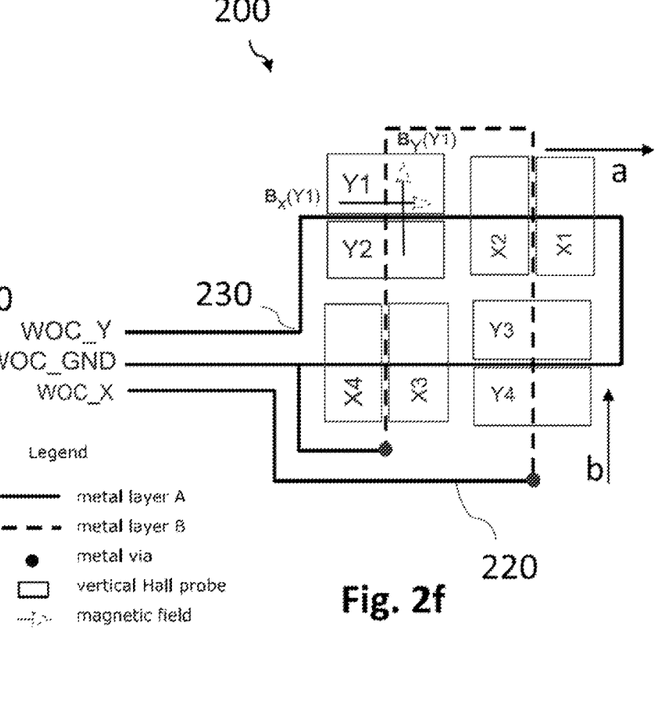

The Hall sensor 200 comprises a conductor track 220, configured to generate a calibration magnetic field B (denoted as $B_o$ in FIG. 2c and as $B_x$ in FIG. 2f). The calibration magnetic field B has a significant component on the sensitive area of the first Hall elements X1 to X4 in the second direction b. The calibration magnetic field B further has a significant component on the sensitive area of the second Hall elements Y1 to Y4 in the first direction a. The calibration magnetic field B is shown on the respective Hall element by way of illustration based on magnetic field vectors, for example B(Y1) to B(Y4) in FIG. 2a, that would arise in the event of a positive flow of current through the conductor track 220 towards a connection WOC_GND of the conductor track 220.

In FIG. 2a, the conductor track 220 forms a largely rectangular shape as a result of its contour. The conductor track 220 runs along a metallization plane A ("metal layer A", see legend in FIG. 2a-f) of the Hall sensor 200 and at a vertical distance from the first Hall elements X1 to X4 and the second Hall elements Y1 to Y4. The conductor track 220 runs at an angle of 45° to the first Hall elements X1 to X4 and at an angle of 45° to the second Hall elements Y1 to Y4.

The conductor track configuration shown in FIG. 2a takes the conductor track 120 through only one metallization plane A, which may increase a homogeneity of the calibration magnetic field B. Additionally, the calibration magnetic field B for the conductor track configuration from FIG. 2a further has a significant component on the sensitive area of the first Hall elements X1 to X2 in the first direction a. Equally, the calibration magnetic field B for the conductor track configuration from FIG. 2a further has a significant component on the sensitive area of the second Hall elements Y1 to Y2 in the second direction b. The conductor track configuration shown in FIG. 2a may therefore allow calibration of both the orientation error and a magnetic sensitivity of the Hall sensor 200.

The conductor track configuration from FIG. 2a may require the first Hall elements X1 to X4 and the second Hall elements Y1 to Y4 to be read differently for an operating mode of the Hall sensor 200, for a first calibration mode for determining the orientation error and for a second calibration mode for determining the magnetic sensitivity. The Hall elements may be read and actuated in the first or second calibration mode for example by way of a calibration apparatus suitable for that purpose. An example of such a calibration apparatus is explained in more detail with reference to FIG. 3.

In the operating mode, the Hall sensor 200 detects for example a magnetic field caused by a magnetic object. The calibration magnetic field B is ideally not present in the operating mode. An output signal y for the operating mode is read as the sum of the individual output signals y1 to y4 of the respective second Hall elements Y1 to Y4, in order to determine a component of a magnetic field in direction b. y is ideally proportional to an average flux density of the component in direction b in the operating mode. A single output signal may be for example a Hall voltage of a respective Hall element. A similar approach is taken in the case of the first Hall elements X1 to X2 in order to detect a component of the magnetic field in direction a.

The magnetic field is ideally not present in the first calibration mode. The calibration apparatus generates the calibration magnetic field B in the first calibration mode and reads an output signal y=y1−y2−y3+y4. y is ideally proportional to a component of the calibration magnetic field B in direction a in the first calibration mode. A similar approach is taken in the case of the first Hall elements X1 to X2 in order to detect a component of the calibration magnetic field B in direction b. In this way, the calibration apparatus is able to determine the orientation error of the Hall sensor 200.

The magnetic field is ideally not present in the second calibration mode. The calibration apparatus generates the calibration magnetic field B in the second calibration mode and reads an output signal y=y1+y2−y3−y4. y is ideally proportional to a component of the calibration magnetic field B along the direction b in the second calibration mode. A similar approach is taken in the case of the first Hall elements X1 to X4 in order to detect a component of the calibration magnetic field B in direction a. In this way, the calibration apparatus is able to determine the magnetic sensitivity of the Hall sensor 200.

In FIG. 2b, the conductor track configuration differs from that from FIG. 2a insofar as the conductor track 220 runs along the metallization plane A in multiple turns. When the conductor track 220 returns to WOC-GND, there is provision for a plated-through hole ("metal via") to a metallization plane B ("metal layer B"). An advantage of the conductor track configuration from FIG. 2b over that from FIG. 2a may be a boost for the calibration magnetic field generated by the conductor track 220 without increasing a current through the conductor track 220.

In FIG. 2c, the conductor track 220 forms a largely cruciform contour. The conductor track 220 runs in the metallization planes A and B in this case. The conductor track 220 runs at an angle of 90° to the first Hall elements X1 to X4 and at an angle of 90° to the second Hall elements Y1 to Y4. This may increase the measurement accuracy for detecting the orientation error.

In FIG. 2c, the Hall sensor 200 further comprises a second conductor track 230. The conductor track 230 runs parallel to an alignment of the first Hall elements X1 to X4 and an alignment of the second Hall elements Y1 to Y4. The conductor track 230 is configured to generate a second calibration magnetic field $B_p$ (denoted as $B_y$ in FIG. 2f). The second calibration magnetic field $B_p$ has a significant component on the sensitive area of the first Hall elements X1 to X4 in the first direction a. The second calibration magnetic field $B_p$ further has a significant component on the sensitive area of the second Hall elements Y1 to Y4 in the second direction b.

In the first calibration mode, the calibration apparatus generates the calibration magnetic field $B_o$ in order to determine the orientation error of the Hall sensor 200. In the second calibration mode, the calibration apparatus generates the second calibration magnetic field $B_p$ in order to determine the magnetic sensitivity. An output signal y of the Hall sensor 200 may be read in a similar manner to that described for FIG. 2a.

In FIG. 2d, the conductor track configuration differs from that from FIG. 2c insofar as the conductor track 220 is largely taken outside a contour of the second conductor track 230. This may be advantageous for specific sensor designs.

In FIG. 2e, the conductor track configuration differs from that from FIG. 2d insofar as the conductor track 230 runs in multiple turns.

In FIG. 2f, the Hall sensor 200 likewise comprises two conductor tracks, the conductor track 220 and the second conductor track 230. The conductor track 220 and the second conductor track 230 have a largely rectangular contour. The conductor track 220 runs parallel to the first Hall elements X1 to X4 and at an angle of 90° to the second Hall elements Y1 to Y4. The second conductor track 230 runs at an angle of 90° to the first Hall elements X1 to X4 and parallel to the second Hall elements Y1 to Y4.

In the first calibration mode, the calibration apparatus is able to pass a positive current through the conductor track 220 towards WOC_GND in order to generate the calibration magnetic field $B_x$. The calibration apparatus is able to determine the orientation error of the second Hall elements Y1 to Y4 based on an output signal y=−y1−y2+y3+y4. Furthermore, the calibration apparatus is able to pass a positive current through the second conductor track 230 towards WOC_GND in the first calibration mode in order to generate the second calibration magnetic field $B_y$. The calibration apparatus is able to determine the orientation error of the first Hall elements X1 to X4 based on an output signal x=−x1−x2+x3+x4.

In the second calibration mode, the calibration apparatus is able to determine the magnetic sensitivity of the second Hall elements Y1 to Y4 based on an output signal y=y1+y2−y3−y4 when the second calibration magnetic field $B_y$ is applied. The calibration apparatus is further able to determine the magnetic sensitivity of the first Hall elements X1 to X4 based on an output signal x=x1+x2−x3−x4 in the second calibration mode when the first calibration magnetic field $B_x$ is applied.

Figure 3:
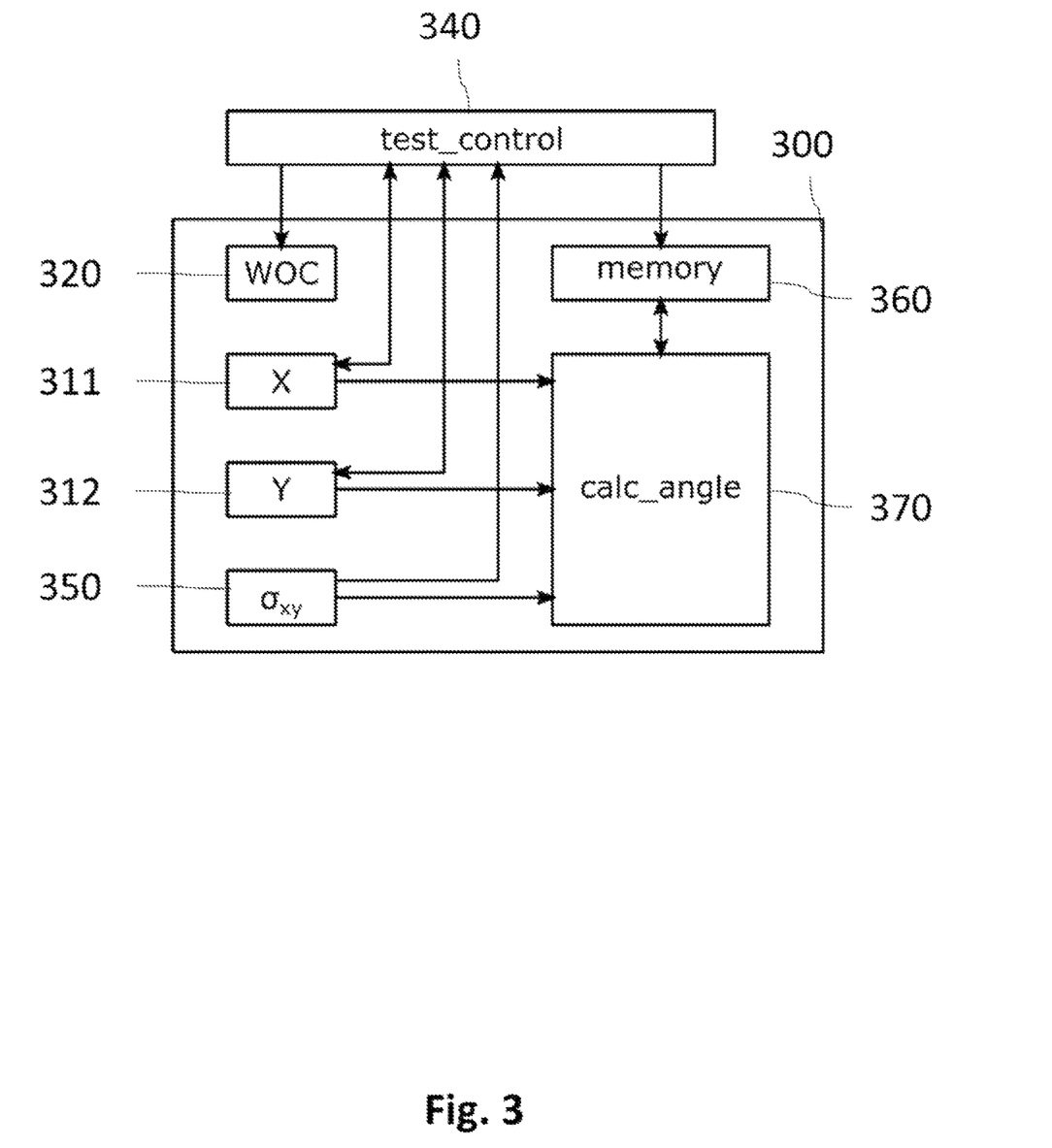
FIG. 3 shows a block diagram of an example of a calibration apparatus for a Hall sensor.

FIG. 3 shows a block diagram of an illustrative calibration apparatus 340 for a Hall sensor 300. The calibration apparatus 340 may be used when calibrating the Hall sensor 300, for example before the Hall sensor 300 is started up, and for example may be connected to electrical contacts of the Hall sensor 300 via electrical contacts of the calibration apparatus 340. The calibration apparatus 340 may be isolated from the Hall sensor 300 after the Hall sensor 300 has been started up.

The calibration apparatus 340 may be configured to configure the Hall sensor 300, e.g., the calibration apparatus 340 may connect up the Hall sensor 300 in a specific manner in order for example to take voltage or current measurements at the Hall sensor 300.

The Hall sensor 300 comprises at least one first Hall element 311, configured to detect a component of a magnetic field in a first direction using a sensitive area of the first Hall element 311. The first Hall element 311 has a first output signal path X, from which a Hall voltage of the at least one first Hall element 311 may be tapped off. Depending on configuration by way of the calibration apparatus 340, the output signal path X may indicate a specific output signal, for example a respective Hall voltage of the respective first Hall element or a sum of Hall voltages of all first Hall elements 311.

The Hall sensor 300 further comprises at least one second Hall element 312, configured to detect a component of the magnetic field in a second direction using a sensitive area of the second Hall element 312. The second Hall element 312 has a second output signal path Y, from which a Hall voltage of the at least one second Hall element 312 may be tapped off.

The Hall sensor 300 further comprises a conductor track (WOC) 320, configured to generate a calibration magnetic field. The calibration magnetic field has a significant component on the sensitive area of the first Hall element 311 in the second direction. The calibration magnetic field further has a significant component on the sensitive area of the second Hall element 312 in the first direction.

The Hall sensor 300 further comprises a shear stress sensor ($\sigma_{xy}$) 350, configured to detect a mechanical shear stress on the sensitive area of the first Hall element 311 and on the sensitive area of the second Hall element 312.

The Hall sensor 300 further comprises a data memory 360 ("memory"), configured to store compensation coefficients that the calibration apparatus 340 has derived from calibration measurements. The Hall sensor 300 further comprises a processing circuit 370 ("calc_angle") in order to determine the magnetic field based on the output signal paths X and Y and the compensation coefficients and for example to derive therefrom an angle of an object causing the magnetic field.

The arrows shown in FIG. 3 represent signal flows between the first output signal path X, the second output signal path Y, the conductor track 320, the shear stress sensor 350, the data memory 360, the processing circuit 370 and the calibration apparatus 340.

The calibration apparatus 340 comprises an electronic circuit (not depicted in FIG. 3). The electronic circuit is configured to pass a current through the conductor track 320 of the Hall sensor 300 in order to generate the calibration magnetic field. The electronic circuit may connect for example a current source to the conductor track 320 in order to pass the current through the conductor track 320.

The electronic circuit is further configured to detect a first voltage across the first Hall element 311 and a second voltage across the second Hall element 312 based on the calibration magnetic field. The first voltage and the second voltage may be at least largely caused by the calibration magnetic field. The electronic circuit is able for example to read the first output signal path X of the first Hall element 311, in order to detect the first voltage, and the second output signal path Y of the second Hall element 312, in order to detect the second voltage. The electronic circuit is further configured to determine an orientation error of the Hall sensor 300 based on the detected first voltage and the detected second voltage. The electronic circuit may comprise for example a processing circuit for processing signals read from the first output signal path X and the second output signal path Y. The electronic circuit is able for example to determine the compensation coefficients based on the detected first voltage and the detected second voltage and to store them in the data memory 350.

FIG. 1 thus shows a calibration and test environment for the Hall sensor 300, which has a specific WOC structure (320). The calibration apparatus 340 may be configured to configure the output signal paths X and Y in order to select a particular calibration mode. The calibration apparatus 340 is able to read the output signal paths X and Y and to calculate specific compensation coefficients. A measurement accuracy may be increased if the calibration apparatus 340 takes two calibration measurements separately: a calibration of the magnetic sensitivity of the Hall sensor 300 or of the respective Hall elements and a further calibration of the orientation error. Each calibration may require a specific configuration of the output signal paths X and Y and/or adaptation of a current (for example current intensity, current direction or current supply point) through the conductor track 320.

The calibration apparatus 340 may allow determination of a magnetic sensitivity and an orientation error of the Hall sensor 300, for example prior to startup. When the Hall sensor 300 is operating, the orientation error may be corrected in order to increase a measurement accuracy of the Hall sensor 300.

In other example implementations, the calibration apparatus 340 may also be used to calibrate a different Hall sensor according to the implementation, for example for Hall sensor 100 or 200. The calibration apparatus 340 may be considered to be part of the Hall sensor according to the implementation or to be separate therefrom.

The text below explains an example of how the calibration apparatus 340 is able to determine the orientation error:

The calibration apparatus 340 may be configured for example to pass a first current through the conductor track 320 and to detect the first voltage (across the first Hall element 311) and the second voltage (across the second Hall element 312) while the first current is passed through the conductor track 320. Passing the current through the conductor track 320 causes a calibration magnetic field. What direction magnetic field lines of the calibration magnetic field have may be definitively determined by a contour of the conductor track 320. Various contours of conductor tracks are shown in FIG. 2a-f. A flux density of the calibration magnetic field may be definitively influenced by the current intensity of the current through the conductor track 320. The calibration magnetic field produces a Hall voltage (the first voltage) across the first Hall element 311 and a Hall voltage (the second voltage) across the second Hall element 312. Since the calibration magnetic field has a significant component on the sensitive area of the respective Hall element different from a setpoint direction of the respective Hall element, the orientation error, which is a difference between an actual measurement direction and the setpoint direction, may be determined based on measurements with the calibration magnetic field.

The calibration apparatus 340 may additionally be configured to pass a second current through the conductor track 320 and to detect the first voltage and the second voltage while the second current is passed through the conductor track 320. By way of example, a current magnitude of the first current may correspond to a current magnitude of the second current and a direction of the first current may be opposite to a direction of the second current. This produces a calibration magnetic field having the same flux density as with the first current, but having the opposite direction. The orientation error may be determined from a difference between the measurements with the first current and measurements with the second current.

The calibration apparatus 340 may further be configured to determine a magnetic sensitivity of the Hall sensor 300 based on the detected first voltage and the detected second voltage. By way of example, the calibration magnetic field may have a significant component on the sensitive area of the first Hall element 311 in the first direction and may have a significant component on the sensitive area of the second Hall element 312 in the second direction. This may be the case with a conductor track configuration as shown in FIG. 2a, for example. In this instance, magnetic field lines of the calibration magnetic field penetrate the sensitive area at an angle of approximately 45°.

The Hall sensor 300 may comprise a second conductor track, which is separate from the conductor track 320. A current passed through the conductor track 320 for a measurement does not flow through the second conductor track in this case, which means that independent measurements based on the conductor track 320 and the second conductor track are possible. The second conductor track preferably has a different contour than the conductor track 320 in order to generate a second calibration magnetic field having a different direction than the calibration magnetic field mentioned above when a current is passed through the second conductor track.

The calibration apparatus 340 may further be configured to pass a current through the second conductor track in order to generate the second calibration magnetic field. The second calibration magnetic field may for example have a significant component on the sensitive area of the first Hall element 311 in the first direction and a significant component on the sensitive area of the second Hall element 312 in the second direction. The calibration apparatus 340 may further be configured to determine a magnetic sensitivity of the Hall sensor 300 based on a voltage across the first Hall element 311 and across the second Hall element 312 that is caused by the second calibration magnetic field. The calibration apparatus 340 may be configured to determine the orientation error based on the determined magnetic sensitivity. The magnetic sensitivity may for example indicate a change in an output voltage (first voltage or second voltage) of the first Hall element 311 or second Hall element 312 with reference to a causative change in the calibration magnetic field. The magnetic sensitivity may therefore also indicate a relationship between a change in the output voltage and a change in a direction of the calibration magnetic field, which may be advantageous for determining the orientation error.

In some example implementations, the calibration apparatus 340 is further configured to determine the orientation error based on the detected mechanical shear stress (for example an initial mechanical shear stress). In particular, this may increase an accuracy of the measurements on the calibration magnetic field, since a mechanical shear stress may show up as an offset in the detected voltages.

The text below uses a further example to explain how the calibration apparatus 340 is able to determine the orientation error:

An accuracy for detecting the compensation coefficients may be increased, for example if the calibration apparatus 340 takes two calibration measurements—firstly (1.): a calibration measurement to detect a magnetic sensitivity of the first Hall element and of the second Hall element, as set forth below; and secondly (2.): a calibration measurement to determine the orientation error, as set forth below. Each of the calibration measurements may require a configuration of the first output signal path X, the second output signal path Y and/or the current through the conductor track WOC.

1. A calibration measurement to determine a magnetic sensitivity Sx and Sy may be performed according to the following operations: 1.1. Set the first output signal path X and the second output signal path Y to a calibration mode for determining the magnetic sensitivity; 1.2. Pass a positive current through the conductor track WOC in the calibration mode from 1.1; 1.3. Read a value $X_p$ from the first output signal path X and a value $Y_p$ from the second output signal path Y, store $X_p$ and $Y_p$; 1.4. Pass a negative current through the conductor track WOC in the calibration mode from 1.1; 1.5. Read a value $X_n$ from the first output signal path X and a value $Y_n$ from the second output signal path Y, store $X_n$ and $Y_n$; 1.6. Determine the magnetic sensitivities $Sx=(X_p-X_n)\cdot ks$ and $Sy=(Y_p-Y_n)\cdot ks$ (ks is a sensitivity-related WOC factor); and 1.7. Store Sx and Sy in the data memory 350.
2. A calibration measurement to determine an orientation error dΦx and dΦy may be performed according to the following operations: 2.1. Read an initial shear stress $\sigma_0$ from the shear stress sensor $\sigma_{xy}$, store the initial shear stress $\sigma_0$; 2.2. Set the first output signal path X and the second output signal path Y to a calibration mode for determining the orientation error; 2.3. Pass a positive current through the conductor track WOC in the calibration mode from 2.2; 2.4. Read a value $X_p$ from the first output signal path X and a value $Y_p$ from the second output signal path Y, store $X_p$ and $Y_p$; 2.5. Pass a negative current through the conductor track WOC in the calibration mode from 2.2; 2.6. Read a value $X_n$ from the first output signal path X and a value $Y_n$ from the second output signal path Y, store $X_n$ and $Y_n$; 2.7. Determine the orientation error (deviation from setpoint measurement direction) dΦx=arc sin((Xp−Xn)/Sx*ko) and dΦy=arc sin((Yp−Yn)/Sy*ko) (ko is an orientation-related WOC factor); 2.8. Determine an initial orientation error OE0=dΦy−dΦx; and 2.9. Store OE0 in the data memory 350.
3. An operating mode used to for detection of an angle of an object causing a magnetic field may be performed according to the following operations: 3.1. Read the shear stress sensor $\sigma_{xy}$; 3.2. Estimate the running orientation error OE=OE0+f($\sigma_{xy}$, $\sigma_0$); (f($\sigma_{xy}$, $\sigma_0$) is a function that indicates a change in the orientation error based on the output signal from the shear stress sensor $\sigma_{xy}$ and the initial shear stress $\sigma_0$); 3.3. Set the first output signal path X and the second output signal path Y to the operating mode; 3.4. Read the first output signal path X and the second output signal path Y; 3.5. Compensate for the estimated running orientation error OE in the values read in 3.4; and 3.6. Determine the angle of the object based on the compensated values from 3.5.

The text below explains an example of how a principle on which the present disclosure is based may be applied to multiple sensor channels:

In particular, an output signal X is modelled as a function of an applied magnetic field B using equation 1 below. For all subsequent equations, it will hold that: vectors are written in bold; the absolute value of a vector is identified by vertical lines; normed unit vectors are written with a circumflex; scalars are written in italics; angles are denoted by Greek letters; angle differences are denoted by a lowercase letter d.

$$X(B)=Sx\cdot(B\cdot\hat{X})+X_0 \qquad \text{Equation 1}$$

Equation 1 describes the magnetic sensitivity Sx, the magnetic offset $X_0$ and the actual sensitivity direction (actual direction) $\hat{X}$.

To determine X(B), multiple measurements may be taken and averaged, for example in order to eliminate the influence of sensor noise. The magnetic offset $X_0$ may be measured for example when no magnetic field is applied, that is to say when $X_0=X(0)$. Alternatively, the magnetic offset $X_0$ may be eliminated when exclusively differences in the output signal X and the magnetic fields are considered, e.g., ΔX(ΔB)=X(B+)−X(B−) for magnetic fields B+ and B−, which arise as a result of positive and negative currents through the conductor track WOC.

The measurements in the calibration mode for determining the magnetic sensitivity take into consideration the component of the magnetic field along the intended sensitivity direction (setpoint direction, lowercase letter ˆ;x). This results in equation 2:

$$\Delta X(\Delta Bx)=X(Bx+)-X(Bx-)=Sx\cdot 2|Bx|\cdot(\hat{;}x\cdot\hat{X}) \qquad \text{Equation 2}$$

The actually applied magnetic field |Bx| may be approximated by way of the sensitivity-related WOC factor (½ks). This factor may be calculated (e.g., using a finite element simulation) or determined by way of precise reference measurements. The applied magnetic field is proportional to the applied current, and therefore the WOC factor (½ks) is inversely proportional to the current intensity. Deviations from the scalar product of the intended sensitivity direction (ˆ;x) and the actual sensitivity direction $\hat{X}$ can be ignored. This may be justified for small deviations dΦx and sometimes leads only to slight inaccuracies in the sensitivity Sx in proportion to $(d\Phi x)^2$. This allows the sensitivity Sx to be calculated using equation 3.

$$Sx=ks\cdot\Delta X(\Delta Bx) \qquad \text{Equation 3}$$

To measure the orientation error, magnetic fields perpendicular to the intended sensitivity direction, e.g., along the sensitivity direction (lowercase letter $\hat{y}$) of the output signal path Y, may be converted by way of the output signal path X. This results in equation 4:

$$\Delta X(\Delta By)=X(By+)-X(By-)=Sx\cdot 2|By|\cdot(\hat{y}\cdot\hat{X}) \qquad \text{Equation 4}$$

The actually applied magnetic field quantity |By| may be approximated based on the orientation-related WOC factor (½ko). It is also possible to determine (½ko) in a similar manner to (½ks), e.g., using a finite element simulation or using the most precise reference measurements possible. The scalar product $\hat{y}\cdot\hat{X}$ from equation 4 corresponds to the cosine of the angle $\angle\hat{y}\hat{X}$ between the intended sensitivity direction $\hat{y}$ of the output signal path Y and the actual sensitivity direction $\hat{X}$ of the output signal path X.

Ideally, this angle may be $\angle\hat{y}\hat{X}$ 90°. The angle $\angle\hat{y}\hat{X}$ may be related to the deviation dΦx (phase shift of the output signal X), for example in the form of dΦx=(90°−$\angle\hat{y}\hat{X}$). Insertion into equation 4 and resolution according to dΦx produces equation 5:

$$d\Phi x=\text{arc sin}(ko\cdot(\Delta X(\Delta By))/Sx) \qquad \text{Equation 5}$$

A similar approach may be taken for the output signal path Y:

$$Sy=ks\cdot\Delta Y(\Delta By);$$

$$d\Phi y=\text{arc sin}(ko\cdot(\Delta Y(-\Delta Bx))/Sy) \qquad \text{Equation 6}$$

The orientation error OE may be calculated using equation 7:

$$OE=d\Phi y-d\Phi x \qquad \text{Equation 7}$$

Figure 4:
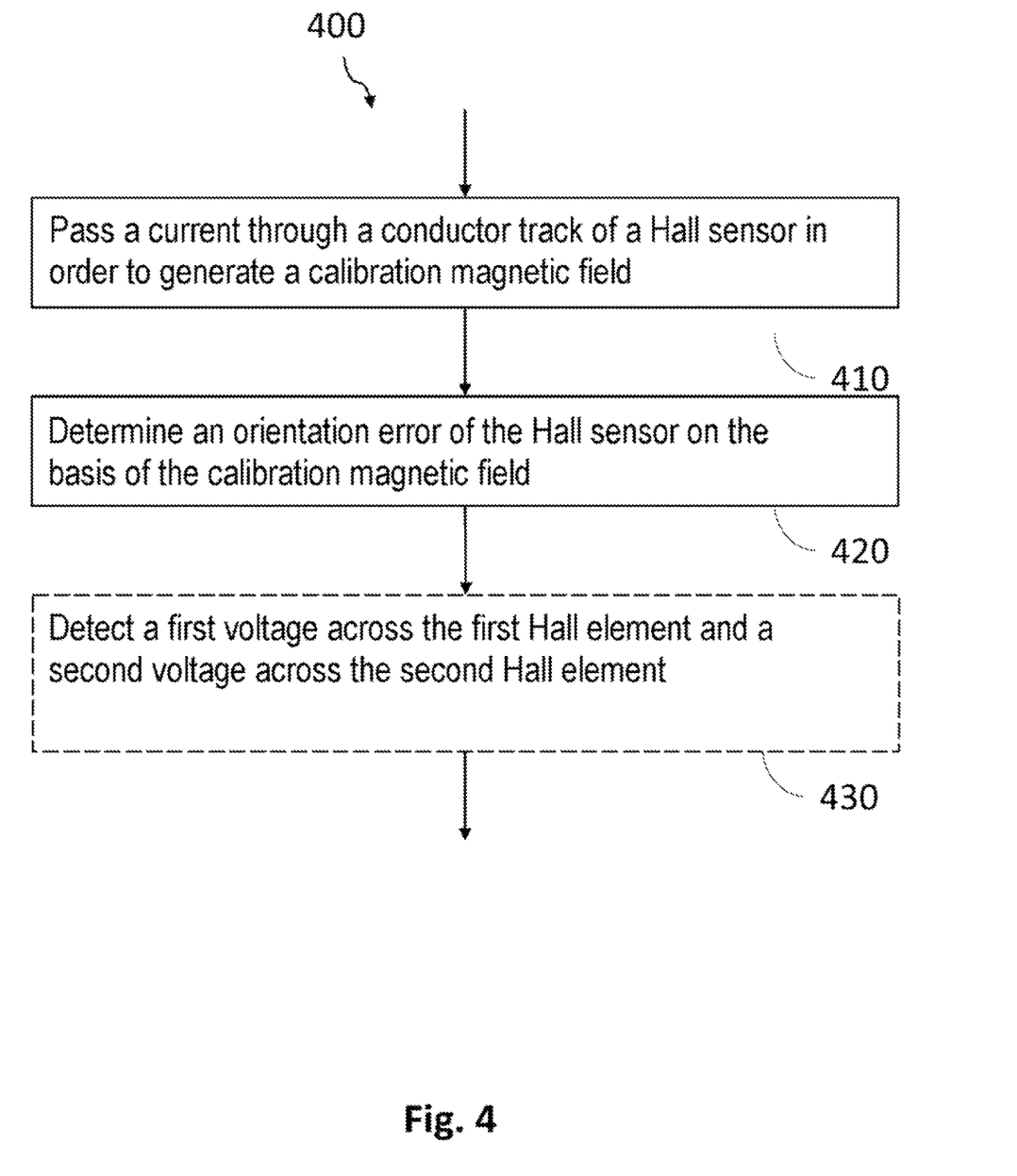
FIG. 4 shows a flowchart for an example of a method for calibrating a Hall sensor.

It will be noted that the procedure described by way of equations 1 to 7 and the sequence description shown above merely provide examples of the calibration of a Hall sensor. In order to illustrate calibration for the purposes of the present disclosure in a general manner, a more abstract example is shown in FIG. 4. FIG. 4 shows a flowchart for an example of a method 400 for calibrating a Hall sensor, for example the Hall sensor 100, 200 or 300. The Hall sensor comprises a first Hall element, a second Hall element and a conductor track. The method 400 comprises passing 410 a current through the conductor track in order to generate a calibration magnetic field and determining 420 an orientation error of the Hall sensor based on the calibration magnetic field.

Optionally, the determining 420 of the orientation error further comprises detecting 430 a first voltage across the first Hall element and a second voltage across the second Hall element. The first voltage and the second voltage are caused by the calibration magnetic field.

In some example implementations, the determining 420 of the orientation error may comprise comparing the first voltage and the second voltage with a (respective) reference voltage. Such a reference voltage of the Hall sensor or of the first Hall element and the second Hall element may be a voltage that should be present across the respective Hall element when the calibration magnetic field is active, provided that a negligibly small or no orientation error occurs.

Further details and aspects of the method 400 are explained in association with the proposed technique or with one or more examples described above, e.g., with reference to FIG. 3. The method 400 may comprise one or more additional optional features that correspond to one or more aspects of the proposed technique or to one or more of the examples described above.

The method 400 may facilitate determining the orientation error of the Hall sensor. Conventional methods for determining the orientation error may comprise for example testing the Hall sensor in a rotating magnetic field. The method 400 does not require the test hardware that is usually necessary for conventional methods, which hardware may be costly and susceptible to hardware defects.

Aspects

The section below relates to further aspect implementations:

Aspect (1) relates to a Hall sensor. The Hall sensor comprises a first Hall element, configured to detect a component of a magnetic field in a first direction using a sensitive area of the first Hall element. The Hall sensor further comprises a second Hall element, configured to detect a component of the magnetic field in a second direction using a sensitive area of the second Hall element. The Hall sensor further comprises a conductor track, configured to generate a calibration magnetic field, wherein the calibration magnetic field has a significant component on the sensitive area of the first Hall element in the second direction and a significant component on the sensitive area of the second Hall element in the first direction. Aspect (2) relates to aspect (1), wherein the first direction is orthogonal to the second direction.

Aspect (3) relates to aspect (1) or aspect (2), wherein the first Hall element and/or the second Hall element is a vertical Hall element.

Aspect (4) relates to one of the preceding aspects, wherein the Hall sensor further comprises at least one further first Hall element, configured to detect a component of the magnetic field in the first direction using a sensitive area of the at least one further first Hall element. The Hall sensor further comprises at least one further second Hall element, configured to detect a component of the magnetic field in the second direction using a sensitive area of the at least one further second Hall element. The calibration magnetic field has a significant component on the sensitive area of the at least one further first Hall element in the second direction and a significant component on the sensitive area of the at least one further second Hall element in the first direction.

Aspect (5) relates to one of the preceding aspects, wherein the Hall sensor further comprises a shear stress sensor, configured to detect a mechanical shear stress on the sensitive area of the first Hall element and on the sensitive area of the second Hall element.

Aspect (6) relates to one of the preceding aspects, wherein the Hall sensor further comprises a calibration apparatus, configured to pass a current through the conductor track in order to generate the calibration magnetic field. The calibration apparatus is further configured to detect a first voltage across the first Hall element and to detect a second voltage across the second Hall element. The first voltage and the second voltage are caused by the calibration magnetic field. The calibration apparatus is further configured to determine an orientation error of the Hall sensor based on the detected first voltage and the detected second voltage.

Aspect (7) relates to aspect (6), wherein the calibration apparatus is further configured to pass a first current through the conductor track and to detect the first voltage and the second voltage while the first current is passed through the conductor track. The calibration apparatus is further configured to pass a second current through the conductor track and to detect the first voltage and the second voltage while the second current is passed through the conductor track.

Aspect (8) relates to aspect (7), wherein a current magnitude of the first current corresponds to a current magnitude of the second current and a direction of the first current is opposite to a direction of the second current.

Aspect (9) relates to aspect (5) and to one of aspects (6) to (8), wherein the calibration apparatus is further configured to determine the orientation error based on the detected mechanical shear stress.

Aspect (10) relates to one of aspects (6) to (9), wherein the calibration magnetic field has a significant component on the sensitive area of the first Hall element in the first direction and a significant component on the sensitive area of the second Hall element in the second direction. The calibration apparatus is further configured to determine a magnetic sensitivity of the Hall sensor based on the detected first voltage and the detected second voltage.

Aspect (11) relates to one of aspects (6) to (9), wherein the Hall sensor further comprises a second conductor track. The calibration apparatus is further configured to pass a current through the second conductor track in order to generate a second calibration magnetic field. The second calibration magnetic field has a significant component on the sensitive area of the first Hall element in the first direction and a significant component on the sensitive area of the second Hall element in the second direction. The calibration apparatus is further configured to determine a magnetic sensitivity of the Hall sensor based on a voltage across the first Hall element and across the second Hall element that is caused by the second calibration magnetic field.

Aspect (12) relates to aspect (10) or (11), wherein the calibration apparatus is further configured to determine the orientation error based on the determined magnetic sensitivity.

Aspect (13) relates to one of the preceding aspects, wherein the conductor track runs along at least one metallization plane of the Hall sensor at a vertical distance from the first Hall element and from the second Hall element.

Aspect (14) relates to aspect (13), wherein the conductor track runs along the at least one metallization plane at an angle of 45° to the first Hall element and at an angle of 45° to the second Hall element.

Aspect (15) relates to aspect (13), wherein the conductor track runs along the at least one metallization plane at an angle of 90° to the first Hall element and at an angle of 90° to the second Hall element.

Aspect (16) relates to one of aspects (13) to (15), wherein the conductor track runs along the at least one metallization plane in multiple turns.

Aspect (17) relates to one of the preceding aspects, wherein at least part of the conductor track is arranged symmetrically with respect to a point of symmetry of a group of Hall elements of the Hall sensor. The group of Hall elements comprises the first Hall element and the second Hall element.

Aspect (18) relates to one of the preceding aspects, wherein the Hall sensor further comprises multiple metallization planes of different thickness at vertical distances from one another. The conductor track runs along one of the multiple metallization planes and the one of the multiple metallization planes has a maximum thickness among the multiple metallization planes.

Aspect (19) relates to one of the preceding aspects, wherein the Hall sensor is further configured to use the magnetic field to determine an angle of the Hall sensor with respect to an object causing the magnetic field.

Aspect (20) relates to a method for calibrating a Hall sensor, wherein the Hall sensor comprises a first Hall element, a second Hall element and a conductor track. The method comprises passing a current through the conductor track in order to generate a calibration magnetic field, and determining an orientation error of the Hall sensor based on the calibration magnetic field.

Aspect (21) relates to aspect (20), wherein the determining of the orientation error further comprises detecting a first voltage across the first Hall element and a second voltage across the second Hall element. The first voltage and the second voltage are caused by the calibration magnetic field.

Aspect (22) relates to a calibration apparatus for a Hall sensor, wherein the Hall sensor comprises a first Hall element, a second Hall element and a conductor track. The calibration apparatus comprises an electronic circuit, configured to pass a current through the conductor track of the Hall element in order to generate a calibration magnetic field, and to detect a first voltage across the first Hall element and a second voltage across the second Hall element based on the calibration magnetic field. The electronic circuit is further configured to determine an orientation error of the Hall sensor based on the detected first voltage and the detected second voltage.

The aspects and features that have been described in association with a specific one of the aspects above may also be combined with one or more of the further aspects in order to replace an identical or similar feature of this further aspect or in order additionally to introduce the feature into the further aspect.

Aspects may furthermore be or relate to a (computer) program comprising a program code for carrying out one or more of the above methods when the program is executed on a computer, a processor or some other programmable hardware component. Steps, operations or processes of various methods from among those described above may thus also be performed by programmed computers, processors or other programmable hardware components. Aspects may also cover program storage apparatuses, e.g., digital data storage media, which are machine-, processor- or computer-readable and code or contain machine-executable, processor-executable or computer-executable programs and instructions. The program storage apparatuses may comprise or be e.g., digital memories, magnetic storage media such as, for aspect, magnetic disks and magnetic tapes, hard disk drives or optically readable digital data storage media. Further aspects may also cover computers, processors, control units, (field) programmable logic arrays ((F)PLAs= (Field) Programmable Logic Arrays), (field) programmable gate arrays ((F)PGAs=(Field) Programmable Gate Arrays), graphics processors (GPUs=Graphics Processor Unit), application-specific integrated circuits (ASICs), integrated circuits (ICs) or systems-on-a-chip (SoCs) that are programmed to carry out the steps of the methods described above.

It furthermore goes without saying that the disclosure of multiple steps, processes, operations or functions disclosed in the description or the claims should not be interpreted as being mandatorily in the order described, unless this is explicitly indicated or absolutely necessary for technical reasons in an individual case. Therefore, the preceding description does not limit the implementation of multiple steps or functions to a specific order. Furthermore, in further aspects, an individual step, an individual function, an individual process or an individual operation may include multiple partial steps, partial functions, partial processes or partial operations and/or be subdivided into them.

Where some aspects in the preceding sections have been described in association with an apparatus or a system, these aspects should also be understood as a description of the corresponding method. In this case, for aspect, a block, an apparatus or a functional aspect of the apparatus or of the system may correspond to a feature, for instance a method step, of the corresponding method. Analogously thereto, aspects described in association with a method should also be understood as a description of a corresponding block, a corresponding element, a property or a functional feature of a corresponding apparatus or a corresponding system.

The claims that follow are hereby incorporated in the detailed description, where each claim may be representative of a separate aspect by itself. Furthermore, it should be taken into consideration that—although a dependent claim refers in the claims to a specific combination with one or more other claims—other aspects may also encompass a combination of the dependent claim with the subject of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

The invention claimed is:

1. A Hall sensor, comprising:
   a first Hall element configured to detect a first component of a magnetic field in a first direction using a first sensitive area of the first Hall element;
   a second Hall element configured to detect a second component of the magnetic field in a second direction using a second sensitive area of the second Hall element; and
   a conductor track configured to generate a calibration magnetic field,
      wherein the calibration magnetic field has a first significant component of a first measurable flux density on the first sensitive area of the first Hall element in the second direction, and
      wherein the calibration magnetic field has a second significant component of a second measurable flux density on the second sensitive area of the second Hall element in the first direction.

2. The Hall sensor as claimed in claim 1, wherein the first direction is orthogonal to the second direction.

3. The Hall sensor as claimed in claim 1, wherein at least one of the first Hall element or the second Hall element is a vertical Hall element.

4. The Hall sensor as claimed in claim 1, further comprising:
a third Hall element configured to detect a third component of the magnetic field in the first direction using a third sensitive area of the third Hall element; and
a fourth Hall element configured to detect a fourth component of the magnetic field in the second direction using a fourth sensitive area of the fourth Hall element,
wherein the calibration magnetic field has a third significant component of a third measurable flux density on the third sensitive area of the third Hall element in the second direction, and
wherein the calibration magnetic field has a fourth significant component on the fourth sensitive area of the fourth Hall element in the first direction.

5. The Hall sensor as claimed in claim 1, further comprising:
a calibration apparatus, configured to:
pass a current through the conductor track in order to generate the calibration magnetic field;
detect a first voltage across the first Hall element;
detect a second voltage across the second Hall element, the first voltage and the second voltage being caused by the calibration magnetic field; and
determine an orientation error of the Hall sensor based on the first voltage detected by the calibration apparatus and the second voltage detected by the calibration apparatus.

6. The Hall sensor as claimed in claim 5, wherein the calibration apparatus is further configured to:
pass the current as a first current through the conductor track in order to generate the calibration magnetic field as a first calibration magnetic field;
detect the first voltage and the second voltage while the first current is passed through the conductor track, the first voltage and the second voltage being caused by the first calibration magnetic field;
pass a second current through the conductor track in order to generate a second calibration magnetic field;
detect a third voltage across the first Hall element while the second current is passed through the conductor track; and
detect a fourth voltage across the second Hall element while the second current is passed through the conductor track, the third voltage and the fourth voltage being caused by the second calibration magnetic field.

7. The Hall sensor as claimed in claim 5, wherein the calibration apparatus is further configured to determine a magnetic sensitivity of the Hall sensor based on the first voltage detected by the calibration apparatus and the second voltage detected by the calibration apparatus.

8. The Hall sensor as claimed in claim 5, wherein the conductor track is a first conductor track and the current is a first current,
wherein the Hall sensor further comprises:
a second conductor track,
wherein the calibration apparatus is further configured to:
pass a second current through the second conductor track in order to generate a second calibration magnetic field,
wherein the second calibration magnetic field has a third significant component of a third measurable flux density on the first sensitive area of the first Hall element in the first direction, and
wherein the second calibration magnetic field has a fourth significant component of a fourth measurable flux density on the second sensitive area of the second Hall element in the second direction; and
determine a magnetic sensitivity of the Hall sensor based on a voltage across the first Hall element and across the second Hall element that is caused by the second calibration magnetic field.

9. The Hall sensor as claimed in claim 1, wherein the conductor track runs along at least one metallization plane of the Hall sensor at a first angle of 45° to the first Hall element and at a second angle of 45° to the second Hall element.

10. The Hall sensor as claimed in claim 1, wherein the conductor track runs along at least one metallization plane of the Hall sensor at a first angle of 90° to the first Hall element and at a second angle of 90° to the second Hall element.

11. The Hall sensor as claimed in claim 9, wherein the conductor track runs along the at least one metallization plane in multiple turns.

12. The Hall sensor as claimed in claim 1, wherein at least part of the conductor track is arranged symmetrically with respect to a point of symmetry of a group of Hall elements of the Hall sensor, and
wherein the group of Hall elements comprises the first Hall element and the second Hall element.

13. The Hall sensor as claimed in claim 6, wherein the first current and the second current are configured to flow in opposite directions.

14. The Hall sensor as claimed in claim 6, wherein the first current and the second current are substantially equal in magnitude.

15. The Hall sensor as claimed in claim 5, wherein the calibration apparatus is configured to determine the orientation error of the Hall sensor based on a difference between the first voltage and the second voltage.

16. The Hall sensor as claimed in claim 6, wherein the calibration apparatus is configured to determine the orientation error of the Hall sensor based on the first voltage, the second voltage, the third voltage, and the fourth voltage.

17. The Hall sensor as claimed in claim 6, wherein the calibration apparatus is configured to determine a first measurement of the first current based on the first voltage and the second voltage, determine a second measurement of the second current based on the third voltage and the fourth voltage, and determine the orientation error of the Hall sensor based on a different between the first measurement and the second measurement.

18. A method for calibrating a Hall sensor, wherein the Hall sensor comprises a first Hall element, a second Hall element and a conductor track, comprising:
passing a current through the conductor track in order to generate a calibration magnetic field,
wherein the first Hall element is configured to detect a first component of a magnetic field in a first direction using a first sensitive area of the first Hall element,
wherein the second Hall element is configured to detect a second component of the magnetic field in a second direction using a second sensitive area of the second Hall element,
wherein the calibration magnetic field has a first significant component of a first measurable flux density on the first sensitive area of the first Hall element in the second direction, and
wherein the calibration magnetic field has a second significant component of a second measurable flux density on the second sensitive area of the second Hall element in the first direction; and determining an orientation error of the Hall sensor based on the calibration magnetic field.

19. The method as claimed in claim 18, wherein the determining of the orientation error further comprises:
   detecting a first voltage across the first Hall element and a second voltage across the second Hall element,
   the first voltage and the second voltage being caused by the calibration magnetic field.

20. A calibration apparatus for a Hall sensor, wherein the Hall sensor comprises a first Hall element, a second Hall element and a conductor track, the calibration apparatus comprising:
   an electronic circuit, configured to:
      pass a current through the conductor track of the Hall sensor in order to generate a calibration magnetic field,
         wherein the first Hall element is configured to detect a first component of a magnetic field in a first direction using a first sensitive area of the first Hall element,
         wherein the second Hall element is configured to detect a second component of the magnetic field in a second direction using a second sensitive area of the second Hall element,
         wherein the calibration magnetic field has a first significant component of a first measurable flux density on the first sensitive area of the first Hall element in the second direction, and
         wherein the calibration magnetic field has a second significant component of a second measurable flux density on the second sensitive area of the second Hall element in the first direction;
      detect a first voltage across the first Hall element and a second voltage across the second Hall element based on the calibration magnetic field; and
      determine an orientation error of the Hall sensor based on the first voltage detected by the calibration apparatus and the second voltage detected by the calibration apparatus.

\* \* \* \* \*